United States Patent [19]

Miyazaki et al.

[11] Patent Number: 4,798,989
[45] Date of Patent: Jan. 17, 1989

[54] SCANNING TUNNELING MICROSCOPE INSTALLED IN ELECTRON MICROSCOPE

[75] Inventors: Yasumichi Miyazaki, Sagamihara; Yasunori Koga, Isehara, both of Japan

[73] Assignee: Research Development Corporation, Tokyo, Japan

[21] Appl. No.: 101,233

[22] Filed: Sep. 24, 1987

[30] Foreign Application Priority Data

Sep. 26, 1986 [JP] Japan .................................. 61-226285
Sep. 26, 1986 [JP] Japan .................................. 61-226286

[51] Int. Cl.$^4$ ...................... H01L 41/08; G01N 23/00
[52] U.S. Cl. ..................................... 310/328; 250/311; 250/491.1; 250/491.2
[58] Field of Search .................. 250/311, 491.1, 491.2; 269/2, 21; 378/34, 35, 205; 74/479; 310/323, 328, 316, 317

[56] References Cited

U.S. PATENT DOCUMENTS

| | | | |
|---|---|---|---|
| 3,217,218 | 11/1965 | Steele | 310/328 X |
| 3,377,489 | 4/1968 | Brisbane | 310/328 |
| 3,551,764 | 12/1970 | Evans | 310/328 X |
| 3,684,904 | 8/1972 | Galutva | 310/328 |
| 3,952,215 | 4/1976 | Sakitani | 310/328 |
| 4,163,168 | 7/1979 | Ishikawa | 310/328 |
| 4,454,441 | 6/1984 | Taniguchi | 310/328 |
| 4,455,501 | 6/1984 | Tojo et al. | 310/328 |
| 4,523,120 | 6/1985 | Assard | 310/328 X |
| 4,622,483 | 11/1986 | Staufenberg, Jr. | 310/328 |
| 4,651,046 | 3/1987 | Ohya et al. | 310/328 |
| 4,678,955 | 7/1987 | Toda | 310/328 |
| 4,686,440 | 8/1987 | Hatamura et al. | 310/317 X |
| 4,709,183 | 11/1987 | Lange | 310/328 |

OTHER PUBLICATIONS

Rev. Scl. Instrum. 56 (8), Aug. 1985, G. F. A. van de Walle, J. W. Gerritsen, H. van Kempen, and P. Wyder, pp. 1573-1576.
Rev. Scl. Instrum. 57 (2), Feb. 1986, Ch. Gerber, G. Binnig, H. Fuchs, O. Marti, and H. Rohrer, pp. 221-224.
A. W. Bailey, Ed. Proceedings of the Annual Meeting of the Electron Microscopy Society of America Copyright 1986.

*Primary Examiner*—Mark O. Budd
*Attorney, Agent, or Firm*—Armstrong, Nikaido Marmelstein & Kubovcik

[57] ABSTRACT

A scanning tunneling microscope installed in a sample chamber of a scanning electron microscope includes a probe which is finely movable along the surface of a sample driven by a probe moving mechanism and within an area which is irradiated by an electron beam issuing from the electron microscope. An electron microscope image is attainable by causing the electron beam to scan the sample surface, and a tunneling microscope image by moving the probe. The probe moving mechanism is implemented with an X-, Y- and Z-direction piezoelectric element actuator assembly. A stage to be loaded with a sample is movable in the Z direction driven by an inchworm motion mechanism which uses piezoelectric element actuators.

5 Claims, 6 Drawing Sheets

SCANNING TUNNELING MICROSCOPE INSTALLED IN ELECTRON MICROSCOPE

BACKGROUND OF THE INVENTION

The present invention relates to a scanning tunneling microscope for measuring the undulation on the surface of a sample by using a tunnel current and, more particularly, to a scanning tunneling microscope which is usable with a scanning electron microscope.

A scanning tunneling microscope whose resolution is as high as namometer order has recently been developed and is attracting increasing attention in various fields such as precision machining, superconduction, medicine and biology, not to speak of surface physics.

A scanning tunneling microscope is adapted to observe the undulation on the surface of a sample by using a tunnel current. When a probe made of tungsten or like metal polished at its tip to the order of 1 micrometer is brought close to the surface of a purified sample of, for example, silicon crystal to a distance of 1 nanometer order and, then, bias voltage of several millivolts to several volts is applied across the probe and the sample, a tunnel current is caused to flow between them. The tunnel current is greatly dependent upon the distance between the probe and the sample surface and is varied exponentially with the distance. Hence, if the probe is moved along the sample surface and, at the same time, the position of the probe is controlled such that the current is maintained constant (order of $10^{-10}$ to $10^{-7}$ amperes), any variation in the height of the sample surface can be determined by using the control signal. By moving the probe in an X and a Y direction, i.e., two-dimensionally along the sample surface, a three-dimensional image of the sample surface is produced.

A microscope of the kind described is capable of measuring undulation on a sample surface with accuracy which is 0.01 nanometer in the vertical direction and 0.2 to 0.3 nanometer in the horizontal direction, without destructing the sample.

A prerequisite with a scanning tunneling microscope is that its probe be moved extremely accurately in three different directions, i.e. X, Y and Z directions. Usually, such an accurate movement is implemented with a piezoelectric element actuator which comprises a laminate of several to several tens of piezoelectric ceramics that are connected in parallel. This piezoelectric element is deformable in proportion to a voltage which is applied from the outside, and it realizes control up to several micrometers by a relatively low voltage of about 100 volts.

However, a scanning tunneling microscope with a piezoelectric element type probe moving mechanism as described above has a drawback that its scanning area is limited. This prevents, for example, the structure of arrangement of steps of a monoatomic layer from being observed, although allowing the steps themselves to be observed. On the other hand, in the field of crystallography, how the step structure of a monoatomic layer is arranged is understood to have considerable significance.

Therefore, there is an increasing demand for the combined use of a scanning tunneling microscope and a scanning electron microscope. The combined use is such that the arrangement of steps is observed through an electron microscope and, thereafter, the step structure in the same position of the same sample is observed through a tunneling microscope. To meet this demand, a tunneling microscope has to be accommodated in the sample chamber of an electron microscope. However, accommodating a tunneling microscope in the sample chamber of an electron microscope has heretofore been impractical since the former has been designed for independent use and constructed in large dimensions to minimize the influence of vibrations and that of temperature drift and other thermal factors.

Further, the probe moving mechanism of a prior art scanning tunneling microscope generally includes three piezoelectric elements which are each assigned to a respective one of X, Y and Z directions. The piezoelectric elements are assembled in a tripod configuration, and a probe is fitted on the tip of the tripod to be controlled three-dimensionally in position. A problem with this arrangement in which three piezoelectric elements are simply combined is that, when one of them is contracted or expanded, the others are also deformed rendering the positional control inaccurate.

In the light of the above, there has been proposed a structure in which six X-direction piezoelectric elements and six Y-direction piezoelectric elements are combined in a lattice configuration, and a probe is mounted at their center through a Z-direction piezoelectric element. Then, the entire assembly is supported by four Z-direction piezoelectric elements. This kind of structure allows the probe to be moved in any of the X, Y and Z directions, facilitating position control. However, when such a probe moving mechanism is located in the sample chamber of an electron microscope, the numerous piezoelectric elements which are disposed above the probe constitute an obstruction to an electronic beam issuing toward a sample surface, which faces the tip of the probe or to secondary electrons coming out from the sample to be detected. Specifically, it is impossible to observe that area of a sample which is observed through a scanning tunneling microscope, to be observed through a scanning electron microscope.

When a tunnelling microscope is used to observe a sample, it is necessary that the distance between a probe and a sample surface be set beforehand to a one which allows a tunnel current to flow. Usually, such is accomplished by moving a stage on which a sample is laid. The stage is also moved when it is desired to change the observing position of a sample. To move the stage so, there has been used a mechanical means such as a feed screw mechanism or a cross roller guide mechanism. A mechanical means, however, cannot eliminate backlash, crosstalk and others which are detrimental to the accuracy of position control. Especially, in the case of a tunneling microscope as described above, position control of nanometer order is required which is almost impracticable with a mechanical means.

It has been customary, therefore, to move a stage of a tunneling microscope by a mechanical sample moving means and, then, to finely move a probe by use of a probe moving mechanism which is implemented with a piezoelectric element. Nevertheless, because the expanding and contracting stroke of a piezoelectric element is extremely short, it is very difficult to set a sample in an area in which the probe moving mechanism is capable of positioning. Moreover, when the positional relationship between the probe and the sample is determined by the probe moving mechanism as stated, the scanning region available is reduced by an amount corresponding to the movement of the probe. While the sample moving mechanism may be implemented with a piezoelectric element, simply causing the piezoelectric element to move the stage would fail to provide a sufficient stroke and, therefore, to accommodate samples of various thicknesses.

SUMMARY OF THE INVENTION

A primary object of the present invention is to allow the image of the same sample at the same position to be readily attained through both of a scanning electron microscope and a scanning tunneling microscope.

Another object of the present invention is to provide a scanning tunneling microscope which can be received in the sample chamber of an electron microscope.

Another object of the present invention is to provide a miniature and accurate probe moving mechanism for a scanning tunneling microscope.

Still another object of the present invention is to control the position of a stage with high accuracy while allowing the stage to be moved over a relatively large stroke.

A further object of the present invention is to provide a sample moving mechanism which is miniature and capable of being controlled in the amount and direction of movement even by remote control.

In order to achive the above objects, in accordance with the present invention, a stage to be loaded with a sample, a probe for detecting a tunnel current flowing between itself and the surface of the sample, and a probe moving mechanism for finely moving the probe are accommodated in a sample chamber of a scanning electron microscope. That area of the sample surface which faces the tip of the probe is irradiated by an electron beam which issues from an object lens of the electron microscope. A control signal associated with the probe moving mechanism is processed by an image processor.

In the above construction, by causing the electron beam to scan the sample surface, an image picked up through the electron microscope is produced. When the probe is moved along the sample surface and the probe scanning mechanism is so controlled as to maintain the tunnel current constant, an image picked up through the tunneling microscope is attainable by image-processing the control signal.

If the stage and the probe moving mechanism are received in the sample chamber of the electron microscope, an anti-vibration mechanism of the electron microscope serves to suppress the influence of externally derived vibrations. This eliminates the need for a special anti-vibration device for the tunneling microscope. Further, because the sample chamber of the electron microscope is evacuated, the thermal influence of the probe section is eliminated.

Further, in accordance with the present invention, a probe moving mechanism for a scanning tunneling microscope includes first X-direction piezoelectric elements which are expansible and contractible in an X-direction, and first Y-direction piezoelectric elements expansible and contractible in a Y direction. The X-and Y-direction piezoelectric elements are combined in such a manner as to define the four sides of a rectangle. X-direction movable blocks moved in the X direction by the X-direction piezoelectric elements and Y-direction movable blocks moved in the Y direction by the Y-direction piezoelectric elements support, respectively, X-Z-direction movable blocks and Y-Z-direction movable blocks through, respectively, first Z-direction piezoelectric elements and second Z-direction piezoelectric elements. A center block is connected to the X-Z- and Y-Z-direction movable blocks by, respectively, second Y-direction piezoelectric elements and second X-direction piezoelectric elements. A probe is mounted on the center block through a control piezoelectric element which is expansible and contractible in the Z direction. The first and second X-direction piezoelectric elements, the first and second Y-direction piezoelectric elements, and the first and second Z-direction piezoelectric elements are individually expansible and contractible under the same condition.

When the first and second Z-direction piezoelectric elements are expanded or contracted, the X-Z- and Y-Z-direction movable blocks are moved in the Z direction at the same time and so is the center block, causing the probe to move in the direction Z. Hence, the probe can be brought close to a sample surface until a predetermined tunnel current flows.

In the above condition, when the first and second X-direction piezoelectric elements are expanded or contracted, the center block is moved in the X direction together with and by the same amount as the X- and X-Z-direction movable blocks, whereby the probe is moved in the X direction. This has no influence on the Y- and Z-direction piezoelectric elements.

By expanding or contracting the first and second Y-direction piezoelectric elements, it is possible to move the probe in the Y direction.

In this manner, the probe is accurately movable in any of the X, Y and Z directions as desired.

The control piezoelectric element is so controlled as to make the tunnel current constant by moving the probe in the X and Y directions while fixing the first and second Z-direction piezoelectric elements at a predetermined length, so that the undulation of a sample surface can be observed in terms of the control voltage.

The probe moving mechanism constituted by the piezoelectric elements and blocks as stated above is miniature enough to be accommodated in the sample chamber of a scanning electron microscope. In addition, a sufficient space is defined above the probe to allow a sample surface located to face the tip of the probe to be observed through a scanning electron microscope.

A sample moving mechanism in accordance with the present invention includes an upper and a lower clamper each having piezoelectric elements mounted in the X and Y directions. The upper and lower clampers are interconnected by a piezoelectric element which is expansible and contractible in the Z direction. When the X- and Y-direction piezoelectric elements are expanded, the upper or lower clamper is fixed to a guide. Each of the X- and Y-direction piezoelectric elements comprises a pair of piezoelectric elements which are expansible and contractible in opposite direction to each other.

A stage is provided on either the upper clamper or the guide. When the stage is provided on the upper clamper, the guide is fixed to a base and the upper and lower clampers are movable along the guide. When the stage is provided on the guide, the guide is movable and the lower clamper is fixed to the base.

When the piezoelectric elements on the upper clamper are expanded to fix the clamper to the guide while, at the same time, the piezoelectric elements on the lower clamper are contracted and the Z-direction piezoelectric element is expanded or contracted, the relative position of the lower clamper and guide is changed. Then, when the lower clamper is fixed to the guide while, at the same time, the piezoelectric elements on the upper clamper are contracted and the Z-direction piezoelectric element expanded or contracted, the relative position of the upper clamper and guide is changed.

The procedure described above is repeated to, when the guide is fixed, move the upper and lower clampers along the guide to thereby move the stage which is provided on the upper clamper. In the case where the lower clamper is fixed, the guide and, therefore, the stage provided thereon is moved. The total amount of movement of the stage depends upon the length of the guide. Hence, a sufficient stroke of the stage is attainable by increasing the length of the guide. In addition, the position of the stage is controllable with high accuracy by controlling the voltage which is applied to the Z-direction piezoelectric element.

If different voltages are applied to the paired X- or Y-direction piezoelectric elements on the upper and lower clampers, the paired piezoelectric elements are expanded by different amounts. This allows the stage to be finely moved in the X- or Y-direction with the upper and lower clampers fixed to the guide.

The use of piezoelectric elements for a mechanism for driving the stage cuts-down the dimensions of the sample moving mechanism and, yet, makes it possible to control the amount and direction of movement of the stage by remote control.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
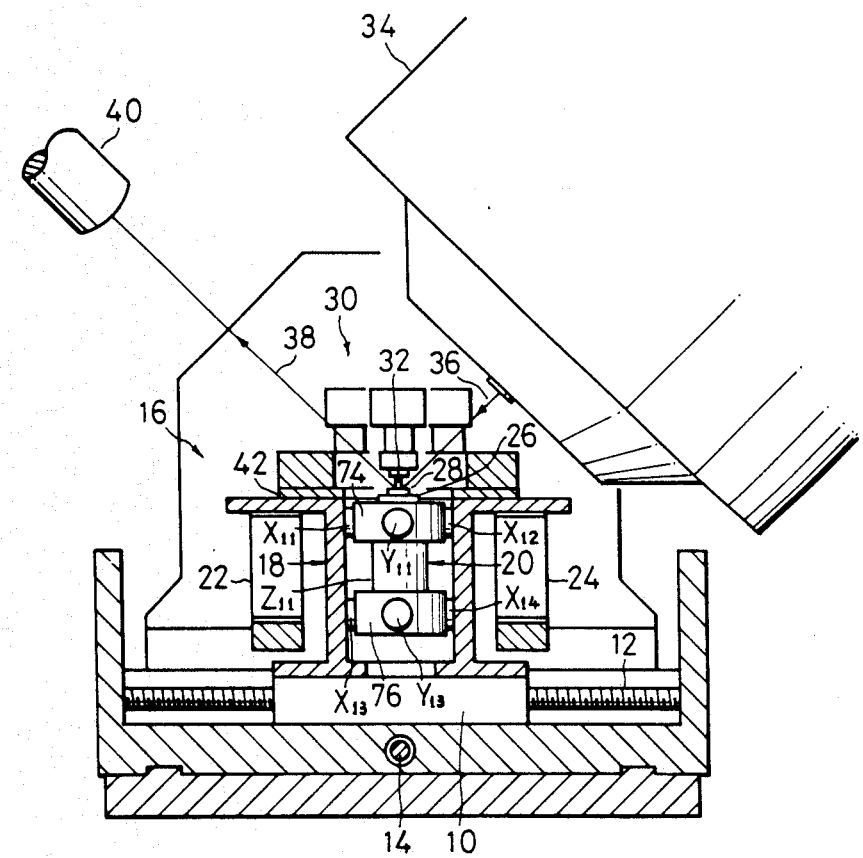
FIG. 1 is a sectional side elevation of a sample chamber of a scanning electron microscope in which a scanning tunneling microscope in accordance with the present invention is disposed.

Referring to FIG. 1, a scanning electron microscope has a sample chamber in which a base 10 is located. The base 10 is movable within an X-Y plane, which is perpendicular to the sheet surface of FIG. 1, driven by a sample position adjusting device that is made up of a pair of perpendicular feed screw mechanisms 12 and 14. Mounted on the base 10 is a sample moving mechanism 16 which is constituted by a cylindrical guide 18 and a movable body 20 which is received in the guide 18. A clamping piezoelectric elements 22 and 24 are mounted on a stationary portion of a frame of the electron microscope and adapted to fix the guide 18 in any desired position in the X-Y plane. A stage 26 is provided on the top of the movable body 20 for supporting a sample 28 thereon.

A probe moving mechanism 30 is mounted on the upper surface of the guide 18 for finely adjusting the position of a probe 32 of a scanning tunneling microscope in the X and Y directions as well as in the Z direction which is perpendicular to the X and Y directions. The mechanism 30 is constituted by a plurality of piezoelectric elements which are individually expansible and contractible in the X, Y and Z directions.

The probe 32 is located within a range in which its tip can be irradiated by an electron beam 36 through an object lens 34 of the electron microscope. Secondary electrons 38 released from the sample 28 by the electron beam 36 are detected by a secondary electrode detector 40 on the electron microscope.

Figure 2:
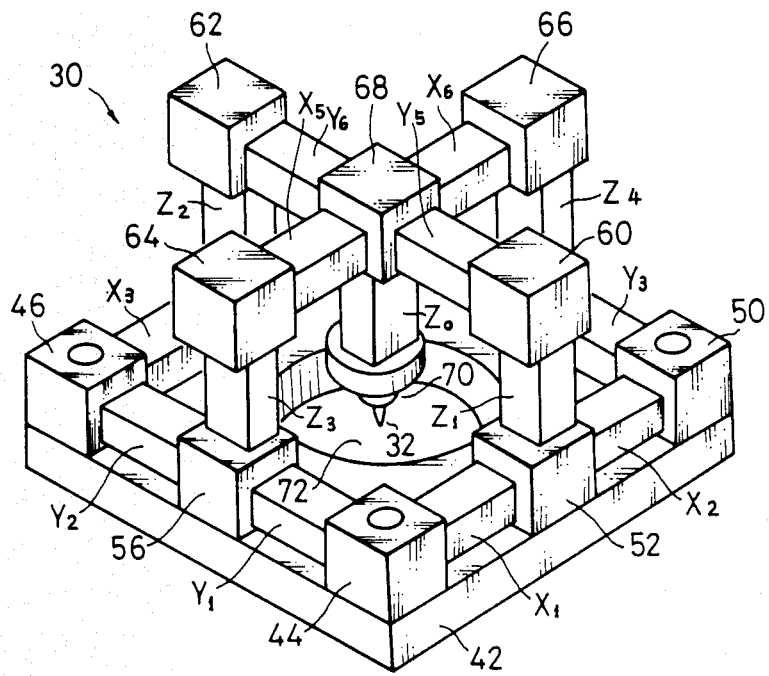
FIG. 2 is a perspective view of a probe moving mechanism included in the tunneling microscope as shown in FIG. 1.
Figure 3:
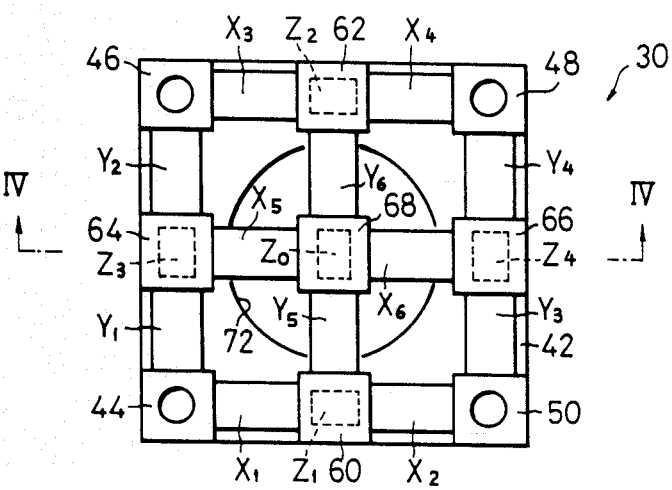
FIG. 3 is a plan view of the probe moving mechanism.
Figure 4:
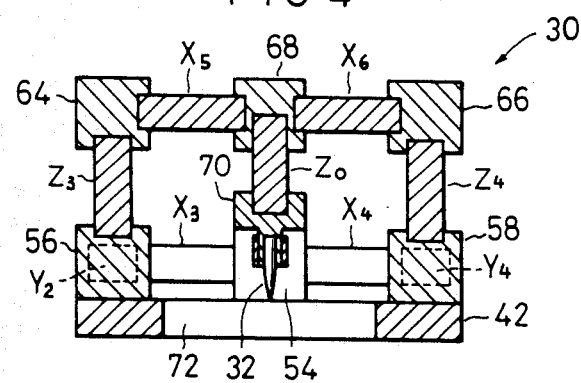
FIG. 4 is a section along line IV—IV of FIG. 3, showing the probe moving mechanism.

As shown in FIGS. 2, 3 and 4, the probe moving mechanism 30 includes a base 42 which is provided with a generally rectangular shape. Blocks 44, 46, 48 and 50 are each fixed at a respective one of four corners of the base 42. X-direction movable blocks 52 and 54 are movably disposed between the fixed blocks 44 and 50 and between the fixed blocks 46 and 48, respectively, which individually define X-direction sides. The movable block 52 is connected to the fixed blocks 44 and 50 by, respectively, X-direction piezoelectric elements $X_1$ and $X_2$ each being expansible and contractible in the X direction. Likewise, the movable block 54 is connected to the fixed blocks 46 and 48 by, respectively, X-direction piezoelectric elements $X_3$ and $X_4$ which are expansible and contractible in the X direction. All these piezoelectric elements $X_1$ to $X_4$ are the same as each other and applied with the same level of voltage. However, the voltage applied to the piezoelectric elements $X_1$ and $X_3$ and that applied to the piezoelectric elements $X_2$ and $X_4$ which respectively neighbor the elements $X_1$ and $X_3$ are opposite in polarity. Hence, when the piezoelectric elements $X_1$ and $X_3$ are expanded, their associated piezoelectric elements $X_2$ and $X_4$ are contracted by the same amount causing the blocks 52 and 54 to move simultaneously by the same amount. Specifically, the piezoelectric elements $X_1$ to $X_4$ serve as first X-direction piezoelectric elements adapted to move the movable blocks 52 and 54 in the X direction.

Y-direction movable blocks 56 and 58 each being movable in the Y direction are positioned between the fixed blocks 44 and 46 and between the fixed blocks 48 and 50, respectively, which define Y-direction sides which are perpendicular to the previously mentioned X-direction sides. The movable block 56 is connected to the fixed blocks 44 and 46 by, respectively, Y-direction piezoelectric elements $Y_1$ and $Y_2$ which are expansible and contractible in the Y direction. The other movable block 58 is connected to the fixed blocks 50 and 48 by, respectively Y-direction piezoelectric elements $Y_3$ and $Y_4$. These piezoelectric elements $Y_1$ to $Y_4$, like $X_1$ to $X_4$, are the same as each other and applied with the same level of voltage except for the difference in polarity as stated in relation to the piezoelectric elements $X_1$ to $X_4$. Hence, when the piezoelectric elements $Y_1$ and $Y_3$ are expanded, their associated piezoelectric elements $Y_2$ and $Y_4$, respectively, are contracted by the same amount. In this manner, the piezoelectric elements $Y_1$ to $Y_4$ serve as first Y-direction piezoelectric elements adapted to move the movable blocks 56 and 58 in the Y direction simultaneously by the same amount.

First Z-direction piezoelectric elements $Z_1$ and $Z_2$ are mounted on, respectively, the X-direction movable blocks 52 and 54 and each is expansible and contractible in the Z direction which is perpendicular to the X and Y directions. Second Z-direction piezoelectric elements $Z_3$ and $Z_4$ are mounted on, respectively, the Y-direction movable blocks 56 and 58 and each is expansible and contractible in the Z direction. These piezoelectric elements $Z_1$ to $Z_4$ are identical with each other and applied with the same voltage, expanding and contracting in the Z direction under the same condition, i.e., simultaneously by the same amount.

Mounted on the ends of the first Z-direction piezoelectric elements $Z_1$ and $Z_2$, respectively, are X-Z-direction movable blocks 60 and 62, and mounted on the ends of the second Z-direction piezoelectric elements $Z_3$ and $Z_4$, respectively, are Y-Z-direction movable blocks 64 and 66. In this configuration, the movable blocks 60 and 62 and the movable blocks 64 and 66 are supported by, respectively, the movable blcoks 52 and 54 and the movable blocks 56 and 58 and moved by, respectively, the first Z-direction piezoelectric elements $Z_1$ and $Z_2$ and the second Z-direction piezoelectric elements $Z_3$ and $Z_4$ under the same condition in the Z direction.

A center block 68 is provided intermediate between the facing X-Z-direction movable blocks 60 and 62 and between the facing Y-Z-direction movable blocks 64 and 66. The center block 68 is connected to the movable blocks 64 and 66 by, respectively, second X-direction piezoelectric elements $X_5$ and $X_6$ each being deformable in the X direction and to the movable blocks 60 and 62 by, respectively, second Y-direction piezoelectric elements $Y_5$ and $Y_6$ each being deformable in the Y direction. The second X-direction piezoelectric elements $X_5$ and $X_6$ are identical in construction with the first piezoelectric elements $X_1$ and $X_2$ and $X_3$ and $X_4$. Specifically, the piezoelectric elements $X_5$ and $X_6$ are the same as each other; the element $X_5$ is applied with the same voltage as applied to the elements $X_1$ and $X_3$, and the element $X_6$ is applied with a voltage which is the same in level as voltage applied to the element $X_5$ but opposite in polarity. The second Y-direction piezoelectric elements $Y_5$ and $Y_6$ are constructed in the same manner as the first piezoelectric elements $Y_1$ and $Y_2$ and $Y_3$ and $Y_4$, respectively. In this construction, the center block 68 is movable in the X direction under the same condition as the X-direction movable blocks 52 and 54 and in the Y direction under the same direction as the Y-direction movable blocks 56 and 58.

A control piezoelectric element $Z_0$ which is expansible and contractible in the Z direction is mounted on the center block 68. The probe 32 is retained by a holder 70 which is mounted on the end of the control piezoelectric element $Z_0$. The base 42 is provided with an opening 72 for receiving the stage 26 which is loaded with the sample 28.

In the probe moving mechanism 30 having the above construction, when a predetermined voltage is applied to the first and second Z-direction piezoelectric elements $Z_1$ to $Z_4$, the elements $Z_1$ to $Z_4$ are each deformed by a predetermined amount, in turn moving the X-Z-direction movable blocks 60 and 62 and Y-Z-direction movable blocks 64 and 66 in the Z direction by the same amount. Such a movement in the Z direction has no influence on the X- and Y-direction piezoelectric elements, i.e., the second X-piezoelectric elements $X_5$ and $X_6$ and the second Y-direction piezoelectric elements $Y_5$ and $Y_6$ are maintained parallel to the first X-direction piezoelectric elements $X_1$ to $X_4$ and the first Y-direction piezoelectric elements $Y_1$ to $Y_4$, respectively. As a result, the center block 68 is moved in the Z direction together with the X-Z-direction movable blocks 60 and 62 and X-Z-direction movable blocks 64 and 66, changing the position of the probe 32 in the Z direciton, i.e. height.

Assume that a predetermined voltage is applied to the first and second X piezoelectric elements $X_1$ to $X_6$ with the probe 32 held in a selected height as stated above. Then, the piezoelectric elements $X_1$, $X_3$ and $X_5$, for example, are expanded by a predetermined amount each, and the other piezoelectric elements $X_2$, $X_4$ and $X_6$ are contracted by the same amount, whereby the X-direction movable blocks 52 and 54 and the center block 68 are moved by the same amount in the X direction. The X-Z-direction movable blocks 60 and 62 are also moved following the movement of the movable blocks 52 and 54, respectively. This does not affect the Y and Z directions at all. In this manner, the probe 32 is moved by a predetermined amount in the X direction. Likewise, when a predetermined voltage is applied to the first and second Y-direction piezoelectric elements $Y_1$ to $Y_6$, the probe 32 is moved in the Y direction by a predetermined amount.

It will be seen from the above that the probe 32 can be caused to scan the X–Y plane by adequately varying the voltage which is applied to the X-direction piezoelectric elements $X_1$ to $X_6$ and that applied to the Y-direction piezoelectric elements $Y_1$ to $Y_6$.

The probe moving mechanism 30 shown and described can be dimensioned less than 2.5 centimeters each side if the scanning area is on the order of 1 micrometer by 1 micrometer. Therefore, as shown in FIG. 1, the mechanism 30 is small enough to be accommodated in the sample chamber of the scanning electron microscope. The blocks 44 to 68 and the base 42 may each be made of aluminum or like light alloy in order to reduce the total weight of the mechanism 30 and, thereby, to increase the specific oscillation frequency up to about 20 kilohertz. Such a high specific oscillation frequency of the mechanism 30 would allow an antioscillation mechanism of the electronic microscope to suppress the influence of externally derived vibrations without the help of any extra mechanism. Further, because the sample chamber of the electron microscope is evacuated, disposing the mechanism 30 in the sample chamber is effective to eliminate thermal influence of the probe 32.

The base of the probe moving mechanism 30 is mounted on the top of the cylindrical guide 18 of the sample moving mechanism 16. An arrangement is made such that the electron beam 36 issuing from the object lens 34 of the electron microscope irradiates the surface of the sample 28 adjacent to the tip of the probe 32 from above any of the fixed blocks 44 to 50 of the mechanism 30 and through any of the spaces defined between the second X-direction piezoelectric elements $X_5$ and $X_6$ and the second Y-direction piezoelectric elements $Y_5$ and $Y_6$, and such that the secondary electrons 38 released from the sample 28 reach the secondary electron detector 40 through the space opposite to the above-mentioned space. Such spaces are secured since the X-direction piezoelectric elements $X_5$ and $X_6$ and the Y-direction piezoelectric elements $Y_5$ and $Y_6$ are simply combined crosswise.

Figure 5:
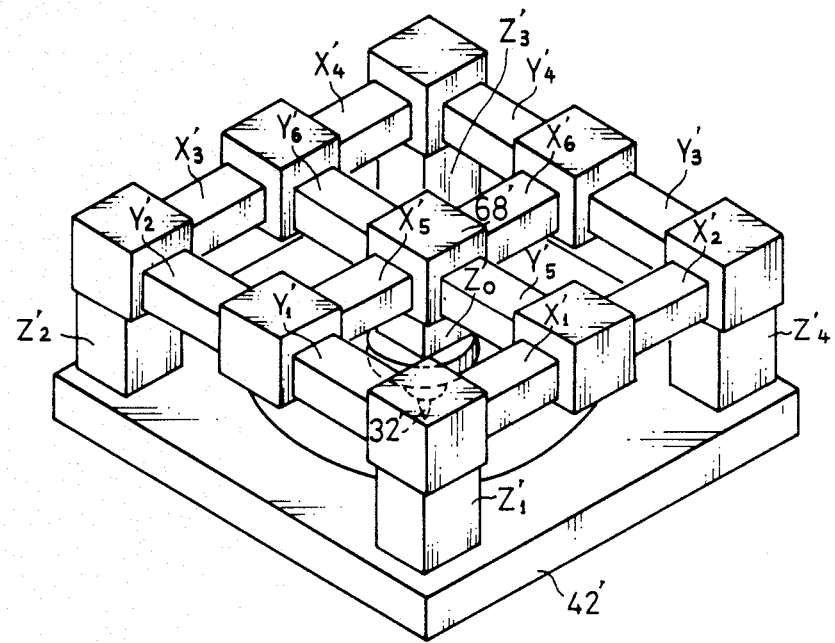
FIG. 5 is a perspective view of an example of prior art probe moving mechanisms.

In contrast, as shown in FIG. 5, a prior art probe moving mechanism includes six X-direction piezoelectric elements $X'_1$ to $X'_6$ and six Y-direction piezoelectric elements $Y'_1$ to $Y'_6$ which are assembled in a lattice configuration. A probe 32' is supported by a center block 68' through a Z-direction control piezoelectric element $Z'_0$. The entire assembly is supported by four Z-direction piezoelectric elements $Z'_1$ to $Z'_4$. In such a structure, spaces for the propagation of an electronic beam from an electronic microscope and the propagation of secondary electrons from a sample are not available.

Figure 6:
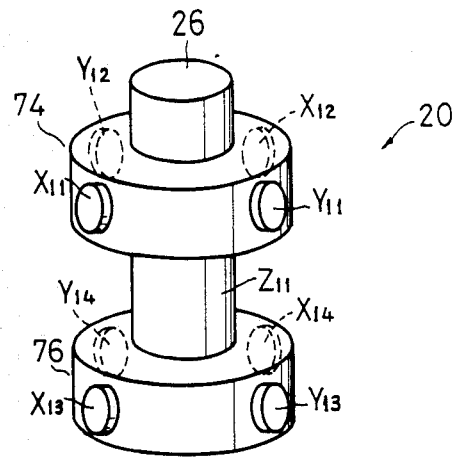
FIG. 6 is a perspective view showing a movable body of a sample moving mechanism which is installed in the microscope of FIG. 1.

As shown in FIG. 1, the guide 18 of the sample moving mechanism 16 is fixed to the base 10. As shown in FIG. 6, the movable body 20 which is housed in the guide 18 includes an upper chamber 74 and a lower clamper 76 each having a disk-like configuration. On the upper chamber 74, first piezoelectric elements $X_{11}$ and $X_{12}$ extend out from opposite sides in the X direction, and second piezoelectric elements $Y_{11}$ and $Y_{12}$ extend out from opposite sides in the Y direction. The first piezoelectric elements $X_{11}$ and $X_{12}$ are expansible and contractible in the opposite direction to each other on a line which extends in the X direction while the second piezoelectric elements $Y_{11}$ and $Y_{12}$ are deformable in the opposite direction to each other on a line which extend in the Y direction. Mounted on the lower clamper 76 are third piezoelectric elements $X_{13}$ and $X_{14}$ which are similar to piezoelectric elements $X_{11}$ and $X_{12}$, and fourth piezoelectric elements $Y_{13}$ and $Y_{14}$ which are similar to the piezoelectric elements $Y_{11}$ and $Y_{12}$.

In the above construction, when the first and second piezoelectric elements $X_{11}$ and $X_{12}$ and $Y_{11}$ and $Y_{12}$ are expanded, they are pressed against the inner periphery of the guide 18 to fix the upper clamper 74 to the guide 18. Likewise, when the third and fourth piezoelectric elements $X_{13}$ and $X_{14}$ and $Y_{13}$ and $Y_{14}$ are expanded, they are pressed against the inner periphery of the guide 18 to fix the lower clamper 76 to the guide 18. When all the piezoelectric elements $X_{11}$ to $X_{14}$ and $Y_{11}$ to $Y_{14}$ are contracted, the clampers 74 and 76 are free to move up and down relative to the guide 18.

Figure 7:
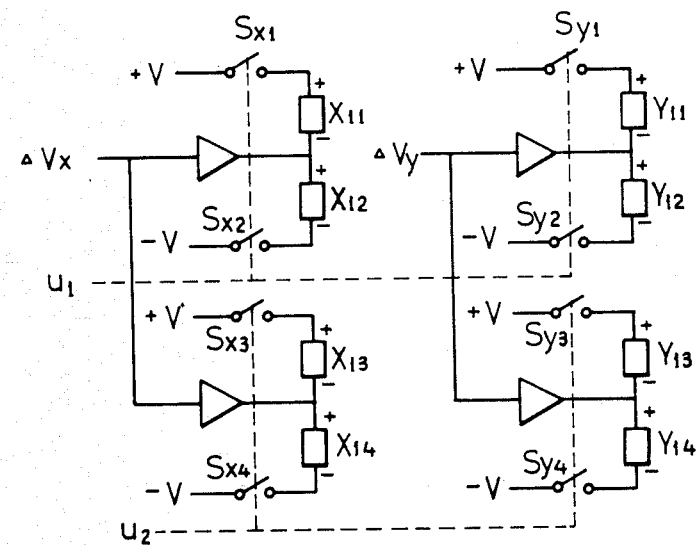
FIG. 7 is a schematic circuit diagram representative of a control device for controlling piezoelectric elements of the sample moving mechanism.

Referring to FIG. 7, a control device for applying voltage to the piezoelectric elements $X_{11}$ to $X_{14}$ and $Y_{11}$ to $Y_{14}$ is shown in a schematic circuit diagram. As shown, a potential of $+V$ is applied via a switch $S_{x1}$ to the positive terminal of the first piezoelectric element $X_{11}$ while, at the same time, a potential of $-V$ is applied via a switch $S_{x2}$ to the negative terminal of the other first piezoelectric element $X_{12}$. A fine movement control potential $\Delta V_x$ is applied to the negative terminal of the piezoelectric element $X_{11}$ and the positive terminal of the piezoelectric element $X_{12}$. The control potential $\Delta V_x$ is variable within a predetermined range the center value of which is zero. Hence, voltages $V - \Delta V_x$ and $V + \Delta V_x$ are applied to the piezoelectric elements $X_{11}$ and $X_{12}$, respectively.

The second piezoelectric elements $Y_{11}$ and $Y_{12}$, third piezoelectric elements $X_{13}$ and $X_{14}$ and fourth piezoelectric elements $Y_{13}$ and $Y_{14}$ are connected in the same manner as the piezoelectric elements $X_{11}$ and $X_{12}$. The same fine movement control potential $\Delta V_x$ as applied to the piezoelectric elements $X_{11}$ and $X_{12}$ is applied to the piezoelectric elements $X_{13}$ and $X_{14}$. A fine movement control potential $\Delta V_y$ applied to the piezoelectric elements $Y_{11}$ and $Y_{12}$ is applied to the piezoelectric elements $Y_{13}$ and $Y_{14}$ as well. Further, switches $S_{y1}$ and $S_{y2}$ associated with the piezoelectric elements $Y_{11}$ and $Y_{12}$, respectively, are opened and closed by the same control signal $u_1$ as adapted to open and close the switches $S_{x1}$ and $S_{x2}$. Switches $S_{x3}$ and $S_{x4}$ associated with the piezoelectric elements $X_{13}$ and $X_{14}$, respectively, and switches $S_{y3}$ and $S_{y4}$ associated with the piezoelectric elements $Y_{13}$ and $Y_{14}$, respectively, are also opened and closed by the same control signal $u_2$.

As shown in FIGS. 1 and 6, the upper chamber 74 and the lower chamber 76 are interconnected by a fifth piezoelectric element $Z_{11}$ which is deformable in the Z direction. A control voltage from the control device is applied to the piezoelectric element $Z_{11}$ at a predetermined timing relative to the timing of voltage application to the piezoelectric elements $X_{11}$, $X_{12}$, $Y_{11}$ and $Y_{12}$ or to that of voltage application to the piezoelectric elements $X_{13}$, $X_{14}$, $Y_{13}$ and $Y_{14}$.

The stage 26 for loading the sample 28 is provided on the top of the upper clamper 74.

In operation, to observe the sample 28, the sample 28 is laid on the stage 26 with the movable body 20 of the sample moving mechanism 16 lowered. Then, the switches $S_{x1}$, $S_{x2}$, $S_{y1}$ and $S_{y2}$ are opened and the switches $S_{x3}$, $S_{x4}$, $S_{y3}$ and $S_{y4}$ are closed. At this stage of operation, both of the fine movement control potentials $\Delta V_x$ and $\Delta V_y$ are maintained zero. Hence, the first and second piezoelectric elements $X_{11}$, $X_{12}$, $Y_{11}$ and $Y_{12}$ are contracted while, at the same time, the third and fourth piezoelectric elements $X_{13}$, $X_{14}$, $Y_{13}$ and $Y_{14}$ are expanded. As a result, the upper clamper 74 becomes freely movable, and the lower clamper 76 is fixed to the guide 18. Then, voltage is applied to the fifth piezoelectric element $Z_{11}$ which is then expanded to raise the upper clamper 74.

Subsequently, the switches $S_{x1}$, $S_{x2}$, $S_{y1}$ and $S_{y2}$ are closed while, at the same time, the switches $S_{x3}$, $S_{x4}$, $S_{y3}$ and $S_{y4}$ are opened. This causes the first and second piezoelectric elements $X_{11}$, $X_{12}$, $Y_{11}$ and $Y_{12}$ to expand so that the upper clamper 74 is fixed to the guide 18, while causing the third and fourth piezoelectric elements $X_{13}$, $X_{14}$, $Y_{13}$ and $Y_{14}$ to contract to make the lower clamper 76 freely movable. Under this condition, the voltage applied to the piezoelectric element $Z_{11}$ is interrupted, whereby the element $Z_{11}$ is contracted to raise the lower clamper 76. Then, the lower clamper 76 is fixed to the guide 18 again while, at the same time, the upper clamper 74 is made free. This is followed by expanding the piezoelectric element $Z_{11}$ to further raise the upper clamper 74.

The above procedure is repeated to sequentially raise the stage 26 and, therefore, the sample 28 toward the probe 32. In this instance, the voltage applied to the piezoelectric element $Z_{11}$ is maintained low to in turn maintain the amount of expansion or contraction of the element $Z_{11}$ small so as to effect fine adjustment.

As the surface of the sample 28 reaches a position where it is to be observed through the electron microscope, all the piezoelectric elements $X_{11}$ to $X_{14}$ and $Y_{11}$ to $Y_{14}$ are expanded to fix the upper and lower clampers 74 and 76, respectively, to the guide 18. The sample 28 may then be observed through the electron microscope.

To change the observing position of the sample 28, the base 10 of the electron microscope is moved in the X-Y plane to move the stage 26 in that plane.

When it is desired to further enlarge the sample 28 during observation, the base 10 is positioned such that the portion of the sample 28 to be observed is substantially aligned with the tip of the probe 32 and, then, the clamping piezoelectric elements 22 and 24 are actuated to fix the guide 18 in place. Subsequently, the control voltage $\Delta V_x$ applied to the first and third piezoelectric elements $X_{11}$ to $X_{14}$ and the control voltage $\Delta V_y$ applied to the second and fourth piezoelectric elements $Y_{11}$ to $Y_{14}$ are suitably changed, whereby the first and third piezoelectric elements $X_{11}$ and $X_{13}$ and the other first and third piezoelectric elements $X_{12}$ and $X_{14}$ are expanded by different amounts from each other, and so are done the second and fourth piezoelectric elements $Y_{11}$ and $Y_{13}$ and the other second and fourth piezoelectric elements $Y_{12}$ and $Y_{14}$. Consequently, the stage 26 is finely moved in the X-Y plane with the upper and lower clampers 74 and 76 fixed to the guide 18. In this manner, a particular portion of the sample 28 to be enlarged can be accurately positioned at the tip of the probe 32.

In the above condition, a bias current is applied across the probe 32 and the sample 28 to cause a tunnel current to flow therebetween. Then, a voltage is applied to the Z-direction piezoelectric elements $Z_1$ to $Z_4$ of the probe moving mechanism 30 so as to finely adjust the position of the probe 32 in the Z direction such that the tunnel current settles at a predetermined value. Subsequently, the probe 32 is moved in the X-Y plane with its position of that instant used as the center, thereby scanning the surface of the sample 28. This is effected by applying adequate scanning voltages to the X-direction piezoelectric elements $X_1$ to $X_6$ and Y-direction piezoelectric elements $Y_1$ to $Y_6$ of the probe moving mechanism 30. During this scanning operation, a control voltage is applied to the control piezoelectric element $Z_0$ so that the tunnel current flowing between the probe 32 and the sample 28 remains constant. If this control voltage and the scanning voltages applied to the piezoelectric elements $X_1$ to $X_6$ and $Y_1$ to $Y_6$ are processed by a suitable image processor, not shown, an image observed through the tunneling microscope can be produced.

As described above, the same position of the same sample can be observed through both of a scanning electron microscope and a scanning tunneling microscope.

The sample moving mechanism 16 shown in FIGS. 1 and 6 is advantageous in that the stage 26 is movable in the Z direction over a substantial distance which corresponds to the length of the guide 18, and in that the position of the sample 28 in the Z direction is controllable to such an extent that a tunnel current flows between the probe 32 and the sample 28, i.e., on a nanometer-order basis. The position of the sample 28 in the X and Y directions, too, is finely controllable on a nanometer-order basis. Further, because the guide 18 is cylindrical and the upper and lower clampers 74 and 76 are discoid, they can be machined with high accuracy to enhance accurate position control. In addition, because the cylindrical guide 18 is received in the movable body 20, the overall construction of the mechanism 16 is miniaturized.

Figure 8:
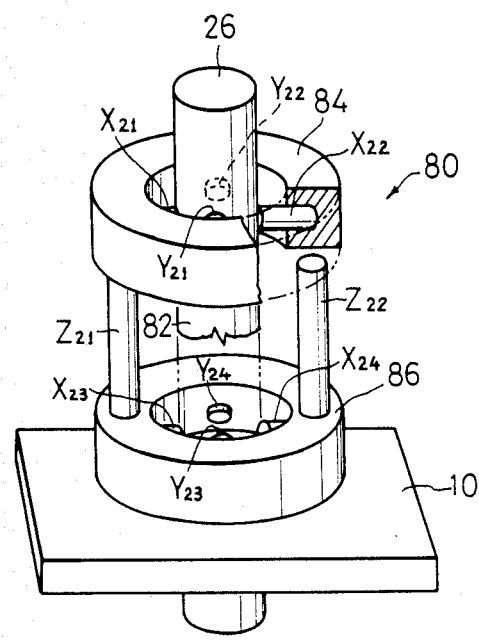
FIG. 8 is a perspective view showing another specific construction of the sample moving mechanism in accordance with the present invention.

Referring to FIG. 8, an alternative construction of the sample moving mechanism is shown. In FIG. 8, the sample moving mechanism 80 comprises a columnar guide 82, and an annular upper clamper 84 and an annular lower clamper 86 each surrounding the guide 82. A pair of first piezoelectric elements $X_{21}$ and $X_{22}$ protrude from the inner periphery of the upper clamper 84 on a line which extends in the X direction. Likewise, a pair of second piezoelectric elements $Y_{21}$ and $Y_{22}$ protrude from the inner periphery of the upper clamper 84 on a line extending in the Y direction. These piezoelectric elements $X_{21}$, $X_{22}$, $Y_{21}$ and $Y_{22}$ are deformable simultaneously toward and away from the guide 82 which is located at the center. Specifically, when expanded, they are fixed to the guide 82 and, when contracted, they are released from the guide 82 to become free. Provided on the lower clamper 86 are third piezoelectric elements $X_{23}$ and $X_{24}$ which are similar to the piezoelectric elements $X_{21}$ and $X_{22}$, and fourth piezoelectric elements $Y_{23}$ and $Y_{24}$ which are similar to the piezoelectric elements $Y_{21}$ and $Y_{22}$. The upper and lower clampers 84 and 86, respectively, are interconnected by a plurality of, two in this embodiment, fifth piezoelectric elements $Z_{21}$ and $Z_{22}$ each being deformable in the Z direction.

The lower clamper 86 is fixed to the base 10. The guide 82 is movable and has a top surface which serves as the stage 26. The rest of the construction is substantially similar to the construction as shown in FIGS. 1, 6 and 7 except that in the arrangement of FIG. 8 the probe moving mechanism 30 is supported by the base 10 through a support which is independent of the guide 82.

In the sample moving mechanism 80, the piezoelectric elements $X_{21}$, $X_{22}$, $Y_{21}$ and $Y_{22}$ on the upper clamper 84 are contracted to make the clamper 84 free while, at the same time, the piezoelectric elements $X_{23}$, $X_{24}$, $Y_{23}$ and $Y_{24}$ on the lower clamper 86 are expanded to fix the clamper 86 to the guide 82. Then, the piezoelectric elements $Z_{21}$ and $Z_{22}$ are contracted so that the upper clamper 84 is lowered with the guide 82 unmoved. Subsequently, the upper clamper 84 is fixed to the guide 82 while, at the same time, the lower clamper 86 is released from the guide 82. This is followed by expanding the piezoelectric elements $Z_{21}$ and $Z_{22}$ to raise the upper clamp 84 and, thereby, the guide 82.

The procedure described above is repeated to raise the stage 26 by a substantial amount, as in the embodiment of FIGS. 1 and 6. The voltage applied to the piezoelectric elements $Z_{21}$ and $Z_{22}$ is controllable to finely adjust the position of the stage 26 in the Z direction. Further, by applying different voltages to the X-direction piezoelectric elements $X_{21}$ and $X_{23}$ and the piezoelectric elements $X_{22}$ and $X_{24}$ and different voltages to the Y-direction piezoelectric elements $Y_{21}$ and $Y_{23}$ and the piezoelectric elements $Y_{22}$ and $Y_{24}$, it is possible to finely adjust the position of the stage 26 in the X and Y directions.

The sample moving mechanism 80 described above makes it needless to fix the guide 82 having a substantial length to the base 10, thereby attaining a reduction in height above the base 10. This promotes effective use of the limited space available in the sample chamber of a scanning electron microscope. Because the clampers 84 and 86 and the piezoelectric elements $X_{21}$ to $X_{24}$, $Y_{21}$ to $Y_{24}$, and $Z_{21}$ and $Z_{22}$ are supported by the base 10, the freedom of design with regard to their weights is increased. The guide 82 may be made of aluminum or like light alloy to promote smooth movement thereof and, therefore, the accuracy of position control.

Even in the embodiment of FIGS. 1 and 6 in which the clampers 74 and 76 are received in the guide 18, an arrangement may be made such that the guide 18 is movable, the lower clamper 76 is fixed to the base 10, and the stage 26 is provided on the guide 18, as in the embodiment of FIG. 8. Conversely, even in the embodiment of FIG. 8 in which the guide 82 is received in the clampers 84 and 86, the guide 82 may be fixed to the base 10 with the clampers 84 and 86 moving along the guide 82, as in the embodiment of FIGS. 1 and 6.

What is claimed is:

1. A mechanism for moving a sample, comprising:
   a sample chamber;
   a sample moving mechanism;
   a sample position adjusting device;
   a stage accommodated in said sample chamber of a scanning electron microscope for loading a sample thereon, said stage being movable in an X-Y plane driven by said sample position adjusting device and said stage being movable in a Z direction by said sample moving mechanism which is mounted on said sample position adjusting device;
   a probe located in proximity to a surface of the sample, which is loaded on said stage, for detecting a tunnel current which flows between said surface of the sample and said probe;
   a probe moving mechanism for finely moving said probe in the X-Y plane which is substantially parallel to the surface of the sample and in the Z direction which is perpendicular to the X-Y plane;
   an image processor for image-processing a control signal associated with said probe moving mechanism;
   a region of the surface of the sample which faces a tip of said probe being irradiated by an electron beam issuing from an object lens of said scanning electron microscope;
   an upper clamper provided with a pair of first piezoelectric elements which are expansible and contractible in opposite direction to each other on a line extending in the X direction, and a pair of second piezoelectric elements expansible and contractible in opposite direction to each other on a line extending in the Y direction which is perpendicular to the X direction, said upper clamper being provided with the stage for loading the sample thereon;
   a lower clamper provided with third piezoelectric elements similar to said first piezoelectric elements and fourth piezoelectric elements similar to said second piezoelectric elements, said lower clamper being connected to said upper clamper by a fifth piezoelectric element which is expansible and contractible in the Z direction perpendicular to the X and Y directions;
   a guide for selectively fixing in place said upper and lower clamps by expanding said first and second piezoelectric elements and said third and fourth piezoelectric elements; and
   a control device for controlling a voltage which is applied to each of said first to fifth piezoelectric elements, said control device applying a different voltage to each of the first to fourth piezoelectric elements which are provided in pairs;
   said guide being fixed to a base.

2. A mechanism for moving a sample, comprising:
   a sample chamber;
   a sample moving mechanism;
   a sample position adjusting device;
   a stage accommodated in said sample chamber of a scanning electron microscope for loading a sample thereon, said stage being movable in an X-Y plane driven by said sample position adjusting device and said stage being movable in a Z direction by said sample moving mechanism which is mounted on said sample position adjusting device;
   a probe located in proximity to a surface of the sample, which is loaded on said stage, for detecting a tunnel current which flows between said surface of the sample and said probe;
   a probe moving mechanism for finely moving said probe in the X-Y plane which is substantially parallel to the surface of the sample and in the Z direction which is perpendicular to the X-Y plane;
   an image processor for image-processing a control signal associated with said probe moving mechanism;
   a region of the surface of the sample which faces a tip of said probe being irradiated by an electron beam issuing from an object lens of said scanning electron microscope;
   an upper clamper provided with a pair of first piezoelectric elements which are expansible and contractible in opposite direction to each other on a line extending in the X direction, and a pair of second piezoelectric elements expansible and contractible in opposite direction to each other on a line extending in the Y direction which is perpendicular to the X direction;
   a lower clamper provided with third piezoelectric elements similar to said first piezoelectric elements and fourth piezoelectric elements similar to said second piezoelectric elements, said lower clamper being connected to said upper clamper by a fifth piezoelectric element which is expansible and contractible in the Z direction perpendicular to the X and Y directions;
   a guide for selectively fixing in place said upper and lower clamps by expanding said first and second piezoelectric elements and said third and fourth piezoelectric elements, said guide being movable and provided with the stage for loading the sample thereon; and
   a control device for controlling a voltage which is applied to each of said first to fifth piezoelectric elements, said control device applying a different voltage to each of the first to fourth piezoelectric elements which are provided in pairs;
   said lower clamper being fixed to a base.

3. A probe moving mechanism for a scanning tunneling microscope, comprising:
   a sample chamber;
   a sample moving mechanism;
   a sample position adjusting device;
   a stage accommodated in said sample chamber of said scanning tunneling microscope for loading a sample thereon, said stage being movable in an X-Y plane driven by said sample position adjusting device and said stage being movable in a Z direction by said sample moving mechanism which is mounted on said sample position adjusting device;
   a probe located in proximity to a surface of the sample, which is loaded on said stage, for detecting a tunnel current which flows between said surface of the sample and said probe, said probe moving mechanism for finely moving said probe in the X-Y plane which is substantially parallel to the surface of the sample and in the Z direction which is perpendicular to the X-Y plane;
   an image processor for image-processing a control signal associated with said probe moving mechanism;
   a region of the surface of the sample which faces a tip of said probe being irradiated by an electron beam issuing from an object lens of said scanning tunneling microscope;

a rectangular base mounted on an upper surface of said sample moving mechanism;

four fixed block each being fixed to the base at a respective one of four corners of the rectangular base which has four sides extending in the X direction and sides extending in the Y direction perpendicular to the X direction;

X-direction movable blocks each being provided on a respective one of the X-direction sides between said fixed blocks and movable in the X direction driven by first X-direction piezoelectric elements which are connected to said fixed blocks and expansible and contractible in the X direction;

Y-direction movable blocks each being provided on a respective one of the Y-direction sides between said fixed blocks and movable in the Y direction driven by first Y-direction piezoelectric elements which are connected to said fixed blocks and expansible and contractible in the Y direction;

X-Z-direction movable blocks each being supported on a respective one of said X-direction movable blocks through a first Z-direction piezoelectric element which is expansible and contractible in the Z direction perpendicular to the X and Y directions, and movable in the Z direction driven by said first Z-direction piezoelectric element;

Y-Z-direction movable blocks each being supported on a respective one of said Y-direction movable blocks through a second Z-direction element which is expansible and contractible in the Z direction under the same condition as said first Z-direction piezoelectric elements, and movable in the Z direction driven by said second Z-direction piezoelectric element; and a center block connected to said Y-Z-direction movable blocks by second X-direction piezoelectric elements which are expansible and contractible in the X direction under a same condition as said first X-direction piezoelectric elements, and said center block being connected to said X-Z movable blocks by second Y-direction piezoelectric elements which are expansible and contractible in the Y direction under a same condition as said first Y-direction piezoelectric elements;

said center block being provided with the probe for detecting a tunnel current which flows between said probe and the surface of a sample, said probe being selectively moved in the X-Y plane by applying scanning voltages to said X-direction and Y-direction piezoelectric elements, a distance between said probe and the surface of the sample being adjusted by applying control voltage to said Z-direction piezoelectric elements.

4. A mechanism as claimed in claim 3, wherein said probe is mounted on said center block through a control piezoelectric element which is expansible and contractible in the Z direction, the control voltage being applied to said control piezoelectric element for adjusting the distance between said probe and the surface of the sample.

5. A mechanism as claimed in claim 3, wherein each of said X-direction and Y-direction piezoelectric elements comprises a pair of piezoelectric elements which are each connected to a respective one of said blocks which face each other, one of said pair of piezoelectric elements being contracted when the other is expanded by a same amount as said other piezoelectric element.

* * * * *